United States Patent [19]
Yamagata

[11] Patent Number: 5,158,899
[45] Date of Patent: Oct. 27, 1992

[54] METHOD OF MANUFACTURING INPUT CIRCUIT OF SEMICONDUCTOR DEVICE

[75] Inventor: Tadato Yamagata, Hyogo, Japan

[73] Assignee: Mitsubishi Denki Kabushiki Kaisha, Tokyo, Japan

[21] Appl. No.: 696,419

[22] Filed: May 6, 1991

[30] Foreign Application Priority Data

May 9, 1990 [JP] Japan .................................. 2-120745

[51] Int. Cl.[5] .......................................... H01L 21/331
[52] U.S. Cl. ...................................... 437/27; 437/51; 437/74; 357/23.13
[58] Field of Search ............................ 437/27, 51, 74; 357/23.13

[56] References Cited

U.S. PATENT DOCUMENTS

| | | | |
|---|---|---|---|
| 3,212,162 | 10/1965 | Moore | 437/149 |
| 4,692,781 | 9/1987 | Rountree et al. | |
| 4,795,716 | 1/1989 | Yilmaz et al. | 437/29 |
| 4,983,534 | 1/1991 | Kikuta | 148/DIG. 10 |

FOREIGN PATENT DOCUMENTS

| | | | |
|---|---|---|---|
| 0165369 | 9/1983 | Japan | 357/23.13 |
| 60-48906 | 10/1985 | Japan | |
| 018796 | 7/1989 | Japan | 357/23.13 |

OTHER PUBLICATIONS

Mitsubishi Electric Corporation, "An Effect of Input Undershoot on Dynamic RAM's Performance", 1989, LSI Research and Development Laboratory.

*Primary Examiner*—Olik Chaudhuri
*Assistant Examiner*—Long Pham
*Attorney, Agent, or Firm*—Lowe, Price, LeBlanc & Becker

[57] ABSTRACT

A method of manufacturing an input circuit of a semiconductor device comprises the steps of forming an N well on the main surface of a P type semiconductor substrate, forming a P well by injecting P type ions upwardly from the N well, and forming an N type region by injecting ions onto the main surface of the P well. An input voltage is applied to the N type region, and the input voltage is applied to the internal circuit formed on the main surface of the semiconductor substrate. A P-N junction is formed between the P well and an N type diffusion layer. When the P-N junction conducts due to the application of an excess voltage into the input voltage, current caused by the excess voltage is absorbed through the N type region formed on the main surface of the N well.

10 Claims, 8 Drawing Sheets

FIG. 9 PRIOR ART
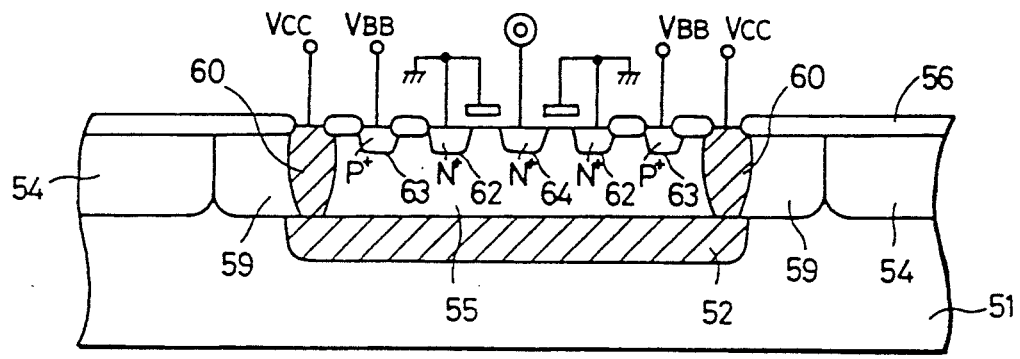
FIG. 10A PRIOR ART
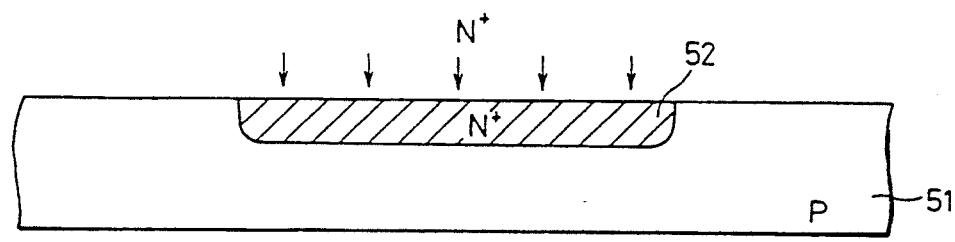
FIG. 10B PRIOR ART
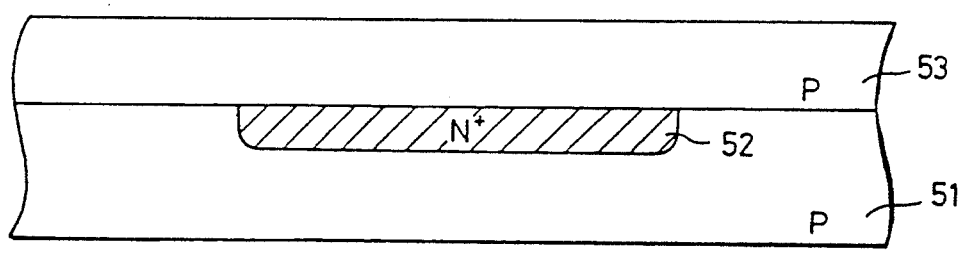
FIG. 10C PRIOR ART 5,158,899

METHOD OF MANUFACTURING INPUT CIRCUIT OF SEMICONDUCTOR DEVICE

BACKGROUND OF THE INVENTION

1. Field of the Invention

The present invention relates generally to a method of manufacturing an input circuit of a semiconductor device, and in particular to a method of manufacturing an input circuit with its internal circuitry being free from the influence of a surge voltage in an input signal.

2. Description of the Background Art

FIG. 7 is a block diagram schematically showing a semiconductor device to which the present invention is applied. Referring to FIG. 7, a semiconductor integrated circuit device 31, to which the present invention is applied, receives an externally applied signal from an external input terminal 32 to transmit the signal through an input protection circuit 33 to the internal circuit. Generally, as shown in FIG. 7, the semiconductor integrated circuit device 31 is usually provided with a circuit called an input protection circuit 33 between the external input terminal 32 and the internal circuit, in order to prevent the breakdown of the internal circuit due to a surge voltage from the external input terminal 32.

The present invention relates to a method of manufacturing a semiconductor device capable of solving a problem caused by injection of electrons from the part where the input signal is communicated to the substrate by a well layer and a diffusion layer, when a surge voltage such as undershoot is applied to the external input terminal 32 and does not relate exclusively to the input protection circuit 33 specifically shown in FIG. 7. An input circuit is described in detail, for example, in U.S. Pat. No. 4,692,781 entitled "Semiconductor Device With Electrostatic Discharge Protection".

Now referring to FIG. 8, a problem concerning a semiconductor device caused by an undershoot will be described. FIG. 8 is a schematic diagram of a dynamic RAM (referred to as DRAM hereinafter) as an example of a semiconductor device. Referring to FIG. 8, the DRAM includes an input circuit 40 and a plurality of memory cells 43. The input circuit 40 includes an N+ diffusion layer 47, and an input terminal 46 connected to the N+ diffusion layer 47. Each of the memory cells 43 includes an NMOS transistor 44 and a capacitor 45. The N+ diffusion layer 47 is connected to the input terminal 46. The N+ diffusion layer 47 forms a part of an NMOS transistor 42 for discharging current generated by voltage, when a high voltage is applied.

In the DRAM having such a configuration, an undershoot in an input signal for example has significant influence upon the characteristic of memory cells. Referring to FIG. 8, if an undershoot in an input signal from the input terminal 46 is input, for example, electrons which are minority carriers are injected into a P-type semiconductor substrate 41, as shown by a dotted line in the figure. The electrons reach the memory cell 43 causing the charge information stored in the memory cell 43 to be broken down. If the memory cell 43 and the input circuit 40 are closely disposed, it becomes easier for the injected electrons to reach the memory cell 43 thereby causing the breakdown. For preventing this problem, a sufficient distance is provided between the memory cell 43 and the input circuit 40, and at the same time a substrate voltage generation circuit is usually provided on the semiconductor substrate 41, which applies a negative voltage $V_{BB}$ to the substrate.

FIG. 11 shows one example of a conventional input circuit. Referring to FIG. 11, the conventional input circuit 70 comprises a P type semiconductor substrate 71, a P well 72 formed on a main surface of the P type semiconductor substrate 71 and an N well 73 formed adjacent to the P well 72. On the main surface of the P well 72, an N+ diffusion layer 78 and an NMOS transistor 75 adjacent to the N+ diffusion layer 78 and connected to the ground potential are formed. An input terminal 77 is connected to the N+ diffusion layer 78, and an input resistance 76 exists in an interconnecting layer therebetween. An input signal is transmitted from the interconnecting layer connecting the input terminal 77 and the N+ diffusion layer 78 to the internal circuit. In the conventional input circuit 70, a parasitic bipolar transistor 74 is formed by the N+ diffusion layer 79, the P well 72 and the N+ diffusion layer 78. A negative voltage $V_{BB}$ is applied by the substrate voltage generating circuit to the P type semiconductor substrate 71. Generally, the substrate potential $V_{BB}$ is about −3V.

The operation of the conventional input circuit 70 will be described. An external input signal is applied through the input terminal 77 and transmitted to the internal circuit through the input resistance 76 as well as to the N+ diffusion layer 78. The NMOS transistor 75 has a very thick gate oxide film, and the gate potential is 0V, and therefore it is normally off. However, when a high electrostatic pulse is applied to the input terminal and a high voltage is applied to the N+ diffusion layer 78, a punch through phenomenon occurs in the NMOS transistor 75 so that the transistor is turned ON, whereby the high voltage is discharged to the ground potential and gate breakdown or the like is prevented in the internal circuit. When an overshoot is applied to the N+ diffusion layer 78, the P-N junction between the N+ diffusion layer 78 and the P well 72 is reversely biased, so that electrons are not introduced to the semiconductor substrate 71.

When an undershoot is applied to the N+ diffusion layer 78, introduction of electrons to the substrate 71 can be prevented until the undershoot reaches $-(|V_{BB}|+V_D)$ V where diffusion potential of the P-N junction is represented as $V_D$, since the P-N junction between the N+ diffusion layer 78 and the P well 72 is reversely biased, as the negative voltage $V_{BB}$ is applied to the substrate 71. For example, if $V_D=0.8V$ and $V_{BB}=-3V$, introduction of electrons to the substrate can be prevented when the undershoot is up to about −3.8V. However, if a plurality of DRAMs are mounted on a board and they are to be operated in the system, an undershoot exceeding this value may be applied to the DRAMs. In such a case, a forward direction voltage is biased to the P-N junction between the above mentioned N+ diffusion layer 78 and the P well 72. Consequently, electrons are introduced to the substrate, which may destroy the information stored in the memory cell. In addition, introduction of the electrons to the substrate also affects the substrate potential itself, which may affect refresh characteristic which is an important characteristic of the DRAM, degrade soft error rate, and cause fluctuation of transistor characteristics such as the threshold value $V_{TH}$ of the memory transistor, current supplying capability $\beta$ of the memory transistor, and so on. Therefore, in the conventional input circuit, not only is a negative voltage $V_{BB}$ applied to the substrate, but the parasitic bipolar transistor 74 is utilized to prevent introduction of electrons to the substrate. More specifically, referring to FIG. 11, a region formed of an N+ diffusion layer 79 and an N well 73 is formed, and the potential of this region is fixed to the supply voltage $V_{CC}$. By providing such a region, a parasitic bipolar NPN transistor 74 is formed between the N+ diffusion layer 79, the N well 73, the P well 72 and the N+ diffusion layer 78. An equivalent circuit thereof is shown in FIG. 12.

Referring to FIG. 12, the operation of the parasitic bipolar NPN transistor 74 will be described. If an undershoot whose absolute value is smaller than $(|V_{BB}|+V_D)$ V is applied to the N+ diffusion layer 78, the parasitic bipolartransistor 74 is OFF. However, if an undershoot whose absolute value exceeds $(|V_{BB}|+V_D)$ V is applied, the parasitic bipolar transistor 74 is turned ON. In principle, the electrons introduced from the N+ diffusion layer 78 hardly flow to the substrate, but flow to the supply voltage $V_{CC}$ through the N+ diffusion layer 79. However, actually, the parasitic bipolar transistor 74 has wide base, so that part of the electrons introduced from the N+ diffusion layer 78 flow to the substrate 71.

Consequently, in the conventional input circuit, destruction of information stored in the memory cells, degradation of refresh characteristic and soft error rate caused by fluctuation of the substrate voltage, malfunctions caused by fluctuation of transistor characteristics derived from fluctuation of the substrate voltage and so on caused by electrons introduced by an undershoot or an overshoot of the input circuit can not be perfectly prevented, and the operation of the internal circuit in the semiconductor device is unstable.

Now a method of manufacturing a conventional input circuit which is free from the above mentioned problem will be described below. FIG. 9 is a schematic diagram showing the structure of the conventional input circuit disclosed in Japanese patent laying open 62-224057.

Referring to FIG. 9, the conventional input circuit includes a P well 55 formed on the main surface of a P-type semiconductor substrate 51, an N+ diffusion layers 52, 60, 60 provided so as to encircle the P-well 55; N+ diffusion layers 62, 62, 64 formed on the main surface of the P well 55; and P+ diffusion layers 63, 63. The N+ diffusion layer 64 is supplied with an input voltage, N+ diffusion layers 62, 64, and a conductor layer formed on the main surface therebetween form an NMOS transistor, and P+ diffusion layers 63, 63 are supplied with a substrate bias potential $V_{BB}$.

Referring to FIGS. 10A to 10F, a method of manufacturing is shown for the input circuit of the conventional semiconductor device shown in FIG. 9. Referring to FIG. 10A, an N+ diffusion layer 52 is formed on the main surface of the P type semiconductor substrate 51 by ion implantation. Referring to FIG. 10B, a P-type epitaxial layer 53 is formed covering over the N+ diffusion layer 52. Referring to FIG. 10C, N wells 54, 54 are formed in prescribed positions on the main surface of the P-type epitaxial layer 53. Referring to FIG. 10D, P-type ion implantation is performed onto the main surface of the P epitaxial layer 53 thereby providing a P well 55. Referring to FIG. 10E, oxide films 56, 56, 57, 57, 58, 58 for the separation of the device are formed on the main surface of the P well 55 and the N wells 54, 54. Referring to FIG. 10F, N wells 60, 60 are formed between the oxide films 57 and 56 by ion implantation. Consequently, the P well 55 is divided into three P wells 55, 59, 59, and the P well 55 is encircled by the N+ diffusion layers 52, 60, 60. A P+ diffusion layers 63, 63 are formed in the two regions which are surrounded by the oxide films 57, 58, and on the main surface of the P well 55 between the two oxide films 58, 58, three N+ diffusion layers 62, 62, 64 are formed. These N+ diffusion layers 62, 62, 64 are utilized to form two NMOS transistors to provide the configuration shown in FIG. 9.

In the structure shown in FIG. 9, when an undershoot with its absolute value beyond $(|V_{BB}|+V_D)$ V is applied, most of the electrons injected from the N+ diffusion layer 64 do not flow toward the substrate 51 but flow into the supply voltage $V_{CC}$ through the N+ diffusion layer 52 and 60.

Therefore, the destruction of the information stored in the memory cell caused by electrons introduced to the substrate at input undershoot, degradation of refresh characteristic or the soft error rate caused by fluctuation of the substrate voltage, and fluctuation of the transistor characteristics can be suppressed. Consequently, an input circuit of a semiconductor device whose internal circuit operates stably can be provided.

The method of manufacturing an input circuit of a conventional semiconductor device is performed as mentioned above. The method of manufacturing the input circuit required not only the implantation of ions but also the growth of epitaxial layer or corresponding techniques and had to go through a very much complicated process flow as a result.

SUMMARY OF THE INVENTION

One object of the present invention is therefore to manufacture an input circuit of a semiconductor device in a method with reduced number of processes.

Another object of the present invention is to manufacture an input circuit of a semiconductor device in a simpler manufacturing method.

A further object of the present invention is to manufacture an input circuit of a semiconductor device without utilizing the technique of epitaxial layer growth.

The above mentioned objects of the present invention are achieved by providing the following steps to a manufacturing method of an input circuit of a semiconductor device. That is, the manufacturing method of an input circuit of a semiconductor device in accordance with the present invention includes a main surface, forming a first impurity region of a second conductivity type opposite to a first conductivity type on the main surface of the semiconductor substrate of the first conductivity type, forming a first region of the first conductivity type on the main surface in the first impurity region of the second conductivity type, and a second region of the second conductivity type for applying an input voltage into the first region of the first conductivity type, and forming a third region of the second conductivity type kept at a prescribed potential on the first main surface of the second conductivity type. The input voltage is applied into the internal circuit formed on the main surface of the semiconductor substrate, and a P-N junction is formed by the first region of the first conductivity type and the second region of the second conductivity type so that an excess voltage is applied into the input voltage whereby a current caused by the excess voltage is absorbed through the third region of the second conductivity type when said P-N junction conducts.

In accordance with the present invention, an input circuit of a semiconductor device can be formed simply by forming successively an impurity region of a different conductivity type on the main surface of the semiconductor substrate. As a result, the input circuit of the semiconductor device can be manufactured in reduced number of process.

Preferably, the steps of forming a first impurity region of a second conductivity type, a first region of a first conductivity type, and a second region of a second conductivity type include the step of forming utilizing the injection of ions.

Because the formation of the impurity regions is achieved only by the injection of ions, the manufacturing method of an input circuit of a semiconductor device will be less complicated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 and FIGS. 10A~10F are diagrams showing a method of manufacturing an input circuit of a conventional semiconductor device.

DESCRIPTION OF THE PREFERRED EMBODIMENTS

Figure 1A:
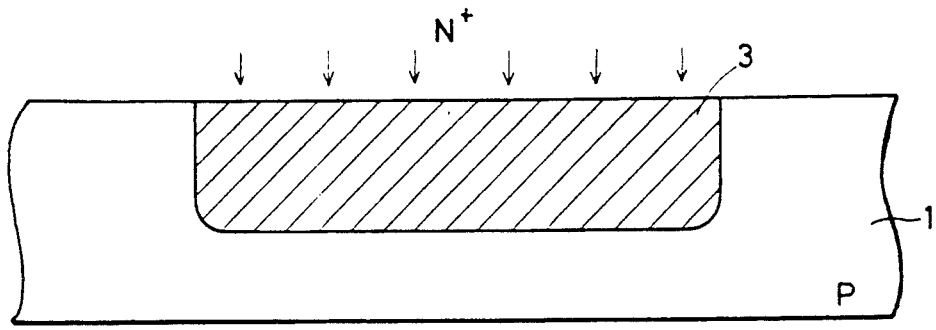
FIGS. 1A~1E are diagrams showing a method of manufacturing an input circuit of a semiconductor device in accordance with the present invention on step by step basis.
Figure 1B:
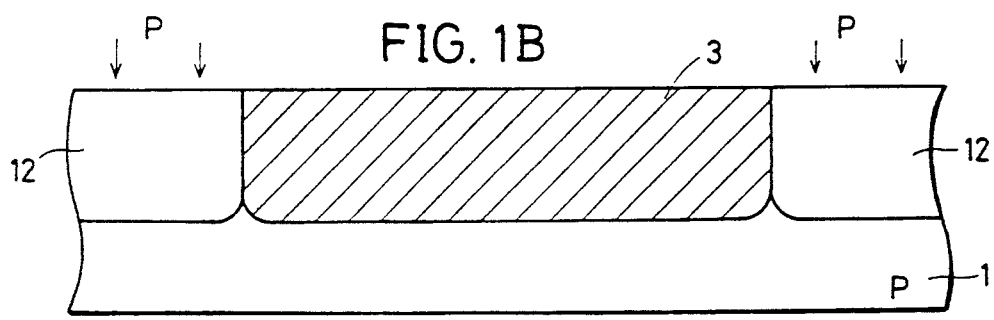
Figure 1C:
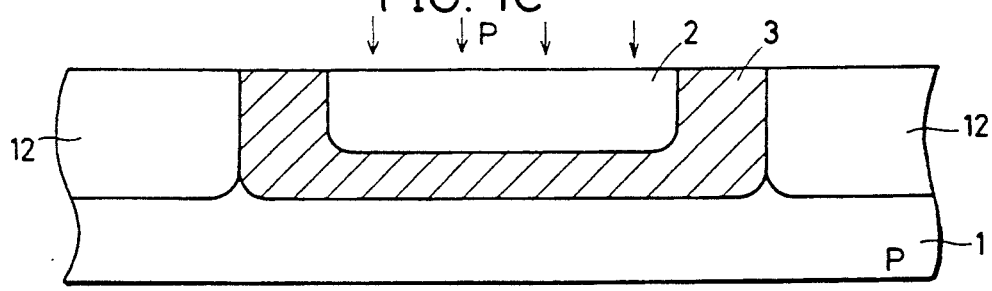
Figure 1D:
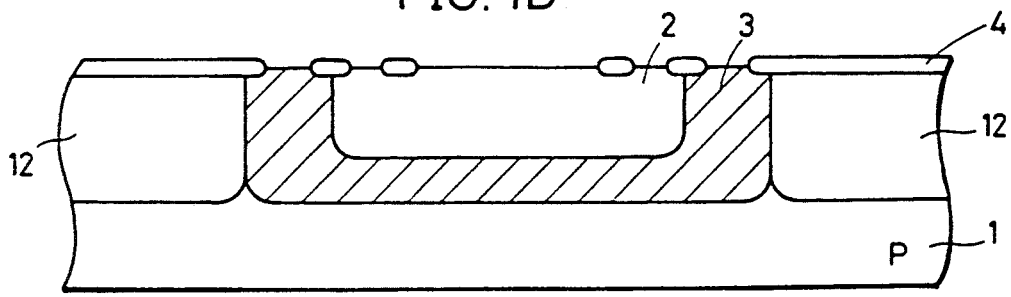

Referring to FIGS. 1A~1E, a method of manufacturing an input circuit of a semiconductor device in accordance with present invention will be described in the following. In the manufacturing method of the input circuit of the semiconductor device in accordance with the present invention, first, an N well 3 is formed on the main surface of a P type semiconductor substrate 1 by ion implantation. P wells 12, 12 are formed by ion implantation in a region adjacent to the N well 3. Now, referring to FIG. 1C, a P well 2 is formed on the main surface of the N well 3 by ion implantation. As can be seen from FIG. 1D, at prescribed positions on the main surfaces of P well 2, N well 3, P well 12, an oxide film 4 is formed.

Figure 1E:
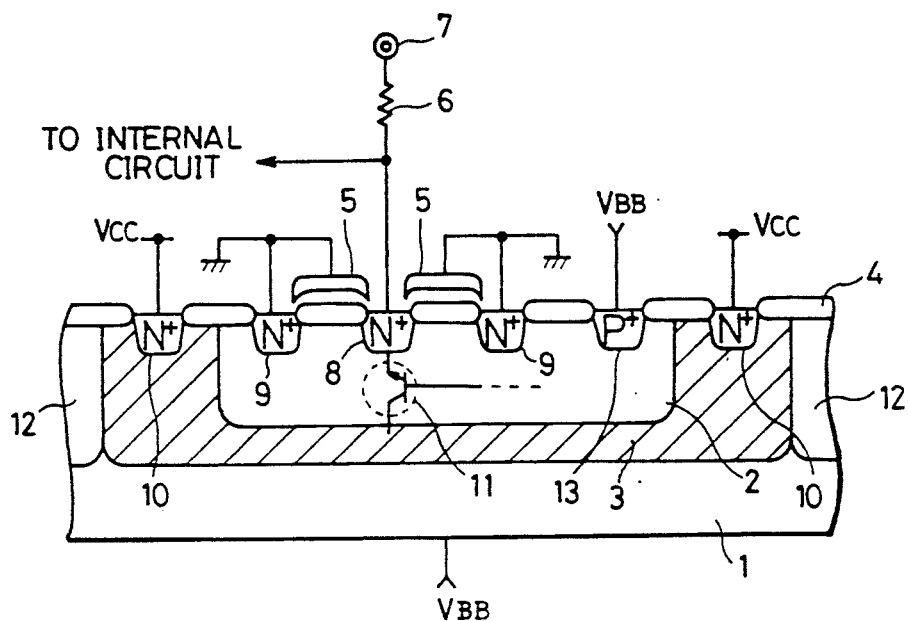

As shown in FIG. 1E, three N+ diffusion layers 8, 9, 9, and one P+ diffusion layer 13 are formed, and two N+ diffusion layers 10, 10 are formed on the main surface of the N well 3. Two sets of two N+ diffusion layers 8, 9 on the main surface of the P well 2 form NMOS transistors 5, 5. N+ diffusion layers 9, 9 to be the gate electrode and the source region of the NMOS transistor 5, respectively are kept at the ground potential. To the P+ diffusion layer 13, a substrate bias voltage $V_{BB}$ is applied, and to the N+ diffusion layers 10, 10 formed on the main surface of the N well 3, an input voltage $V_{CC}$ is applied. To the N+ diffusion layer 8 to be the drain region of the NMOS transistors 5, 5, an input terminal 7, to which an input signal is applied through an input resistor 6, is connected. A signal input from the input terminal 7 is transmitted to an internal circuit (not shown) formed on the main surface of the semiconductor substrate 1 through the input resistor 6.

The method of manufacturing the input circuit of the semiconductor device in accordance with the present invention shown in FIGS. 1A~1E requires very small number of manufacturing processes compared to that of the method shown in FIGS. 10A~10F and FIG. 9, and without utilizing the technique of epitaxial growth or a technique corresponding thereto, an input circuit of a semiconductor device can be manufactured simply by repeating the step of injecting ions of different conductivity types.

Figure 2:
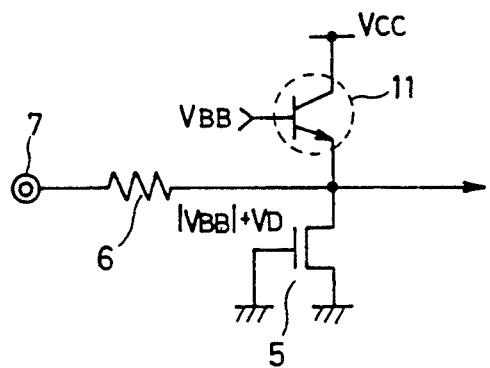
FIG. 2 is an equivalent circuit diagram of the input circuit of the semiconductor device shown in FIG. 1E in accordance with the present invention.

Now, the operation of the input circuit in accordance with the present invention shown in FIG. 1E will be described in conjunction with FIG. 1E and FIG. 2 showing the equivalent circuit. An externally input signal is applied from the input terminal 7, then transmitted into the internal circuit through the input resistor 6 and then applied to the N+ diffusion layer 8. The NMOS transistor 5 has a very thick gate oxide film, the gate potential of which is 0V, and is usually in its off state. When a high electrostatic pulse is added to the input terminal and a high voltage is applied to the N+ diffusion layer 8, the NMOS transistor 5 is turned on causing punch through and discharges the high voltage to the ground potential thereby preventing the gate in the internal circuit from being broken down. In case an overshoot is applied to the N+ diffusion layer 8, the P-N junction between the N+ diffusion layer 8 and the P well 2 is to be biased reversely, so that the injection of electrons into the semiconductor substrate 1 will not take place.

In case an undershoot is applied to the N+ diffusion layer 8, a negative voltage $V_{BB}$ is applied to the substrate 1, and assuming $V_D$ as the diffusion potential of the P-N junction, the P-N junction between the N+ diffusion layer 8 and the P well 2 will be therefore biased backward until $-(|V_{BB}|+V_D)$ V undershoot takes place, so that the injection of electrons into the substrate 1 can be prevented. For example, assuming $V_D = 0.8V$, $V_{BB} = -3V$, up to an undershoot of approximately $-3.8V$, the injection of electrons into the substrate can be prevented. However, in case a plurality of DRAMs are installed onto the board and operated in the system, an undershoot more than that can be applied to these DRAMs. In such a case, the above mentioned P-N junction between the N+ diffusion layer 8 and the P well 2 is biased forward. It is predicted that the injection of electrons to the P well 2 might therefore take place.

However, since the electric resistance of the N well 3 is usually far smaller than that of the substrate 1, most of the electrons injected from the N+ diffusion layer 8 do not flow toward the substrate 1 but flow into the supply voltage $V_{CC}$ through the N+ diffusion layer 10.

Therefore, the destruction of the information stored in the memory cell caused by electrons introduced to the substrate at input undershoot, degradation of refresh characteristic or the soft error rate caused by fluctuation of the substrate voltage, and fluctuation of the transistor characteristics can be suppressed. Consequently, an input circuit of a semiconductor device whose internal circuit operates stably can be provided.

As a result, in the input circuit in accordance with the present invention, the injection of electrons into the substrate is prevented not only by applying a negative voltage $V_{BB}$ to the substrate but also utilizing a parasitic bipolar transistor 11. That is, as can be seen in FIG. 1E, a region is formed of the P well 2, the N+ diffusion layer 8, and the N well 3, and the potential of N well 3 is fixed to the supply voltage $V_{CC}$. The provision of such a region allows the formation of a parasitic bipolar NPN transistor 11 between the N+ diffusion layer 8, the N well 3, and the P well 2.

When an undershoot with its absolute value below $(|V_{BB}|+V_D)$ V is applied to the N+ diffusion layer 8, the parasitic bipolar transistor 11 is in its OFF state, and when an undershoot with its absolute value beyond $(|V_{BB}|+V_D)$ V is applied, the parasitic bipolar transistor 11 is turned ON. At the time, since the electric resistance of the N well 3 is usually far smaller than that of the substrate 1, most of the electrons injected from the N+ diffusion layer 8 do not flow toward the substrate 1 but flow into the supply voltage $V_{CC}$ through the N+ diffusion layer 10.

Figure 3:
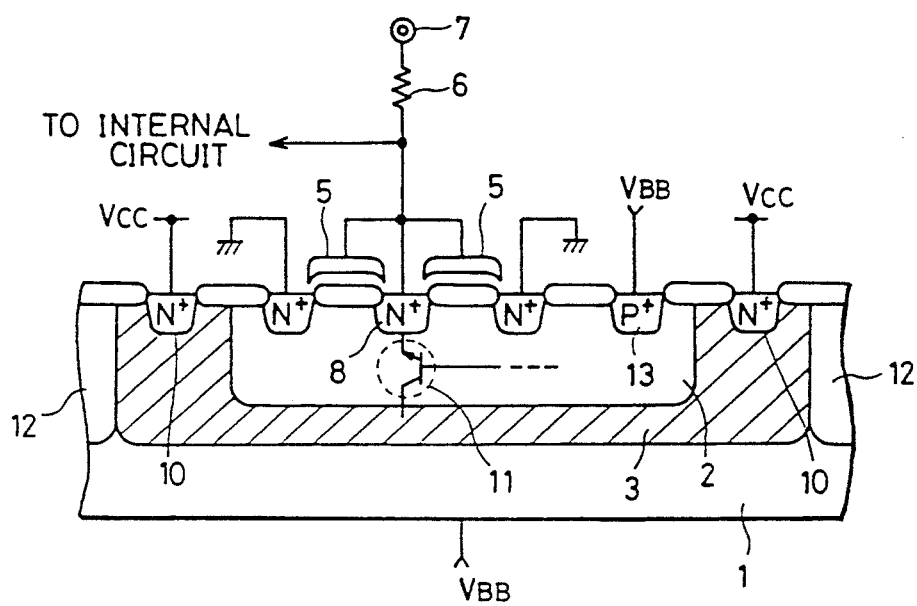
FIG. 3 is a diagram showing another embodiment of the input circuit of the semiconductor device in accordance with the present invention.
Figure 4:
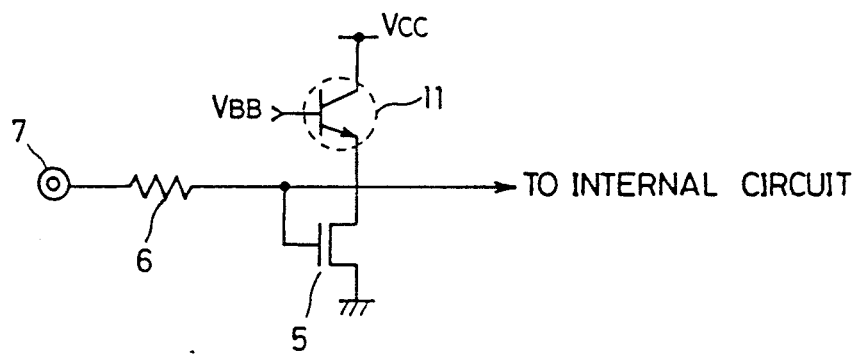
FIG. 4 is an equivalent circuit diagram of the input circuit of the semiconductor device shown in FIG. 3.

FIG. 3 shows an input circuit in another embodiment in accordance with the present invention, and FIG. 4 is an equivalent circuit diagram of the same. What is different from the embodiment shown in FIG. 1 is, that the gate electrode of the NMOS transistor 5 is connected on the input side. The NMOS transistor 5 whose gate oxide film is very thick has a very high threshold voltage and is usually in its OFF state. When a high electrostatic pulse is added to the input terminal, and a high voltage is applied to the gate electrodes of the NMOS transistor 5 and the N+ diffusion layer 8, however, the NMOS transistor 5 is turned ON so that the high voltage is discharged into the ground potential thereby preventing the breakdown of the gate in the internal circuit.

In case an overshoot or an undershoot is added to an input signal, the same operation as mentioned above is carried out thereby providing the same effect.

In the above mentioned two embodiments (FIGS. 1~4), the potential of the P well 2 is set to be the substrate voltage $V_{BB}$, it should be noted that the voltage may be any negative voltage below the ground potential. For example, if the potential of the P well 2 is set to be the ground potential, when an input undershoot beyond $-V_D$ is applied to the N+ diffusion layer 8, the NPN parasitic bipolar transistor 11 is turned on, and the electrons to be injected from the N+ diffusion layer 8 will flow into the $V_{CC}$ through the N well 3 and the N+ diffusion layer 10. At the time, the same effect as mentioned above is provided because there is no necessity to inject any minority carrier into the substrate and the substrate voltage is not affected. If the potential of the P well 2 is set to be a positive voltage value, the P-N junction between the N+ diffusion layer 8 and the P well 2 may be biased forward even in the time of the normal operation when there is no undershoot in an input signal, and therefore the potential of the P well 2 must not lie on a positive voltage value. Additionally, although the potential of N well 3 is set to be $V_{CC}$ in the above mentioned two embodiments (FIGS. 1~4), the potential may be any voltage beyond the ground voltage. For preventing the situation in which the P-N junction between the P well 2 and the N well 3 or the P-N junction between the P type semiconductor substrate 1 and the N well 3 is easily biased forward, it is desirable that the potential difference between the P well 2 and the N well 3 and the potential difference between the N well 3 and the P type substrate 1 are appropriately large enough.

Figure 5:
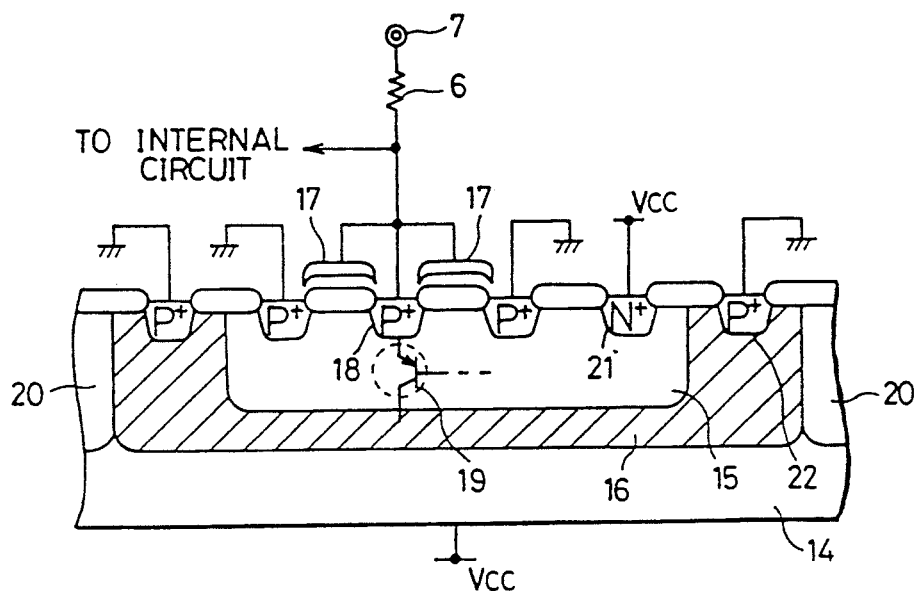
FIG. 5 is a diagram of a further embodiment of the input circuit of the semiconductor device in accordance with the present invention.
Figure 6:
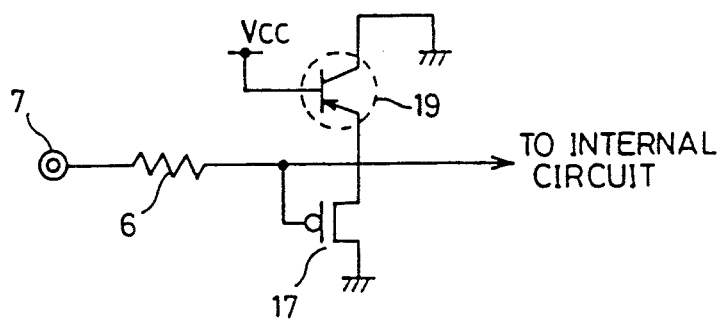
FIG. 6 is an equivalent circuit diagram of the input circuit of the semiconductor device shown in FIG. 5.
Figure 7:
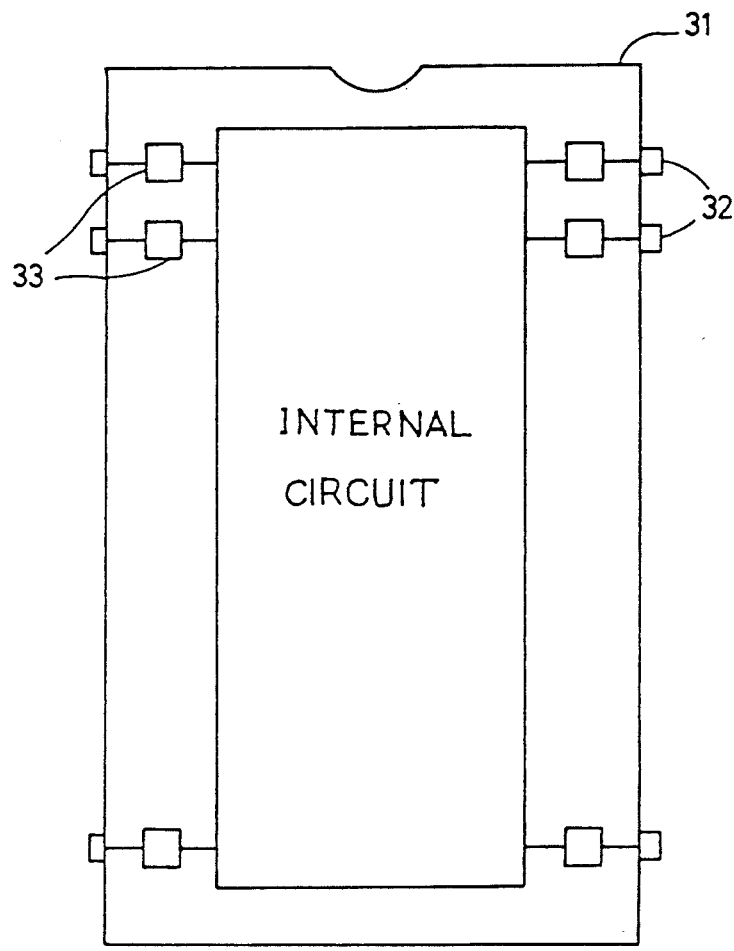
FIG. 7 is a schematic diagram of a semiconductor integrated circuit device for describing the background of the present invention.
Figure 8:
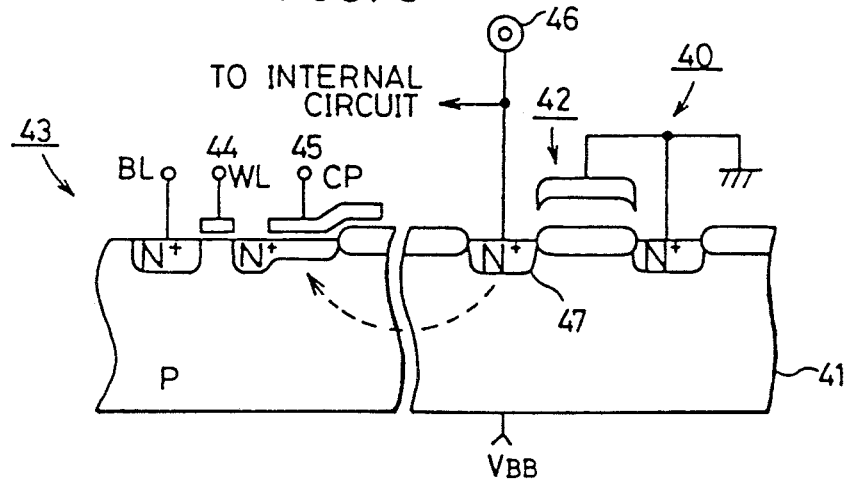
FIG. 8 is a diagram for clarifying a problem concerning a conventional input circuit.
Figure 10D:
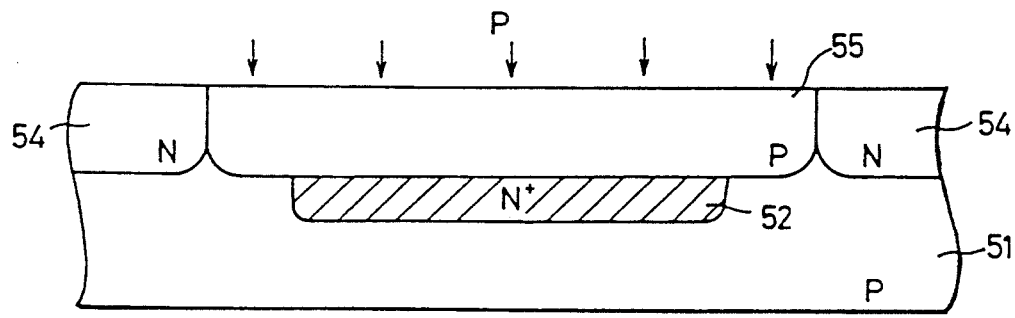
Figure 10E:
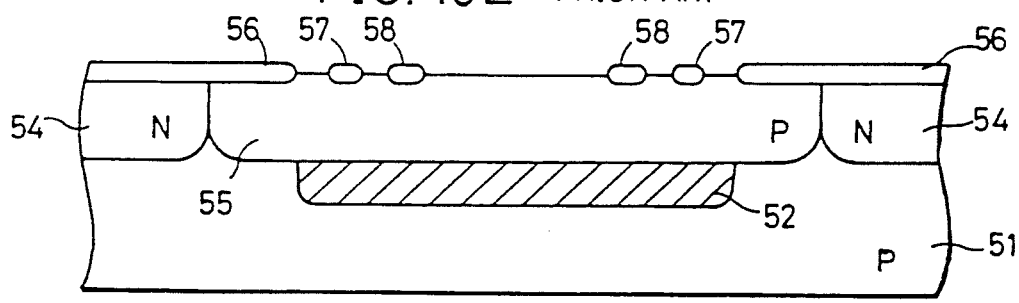
Figure 10F:
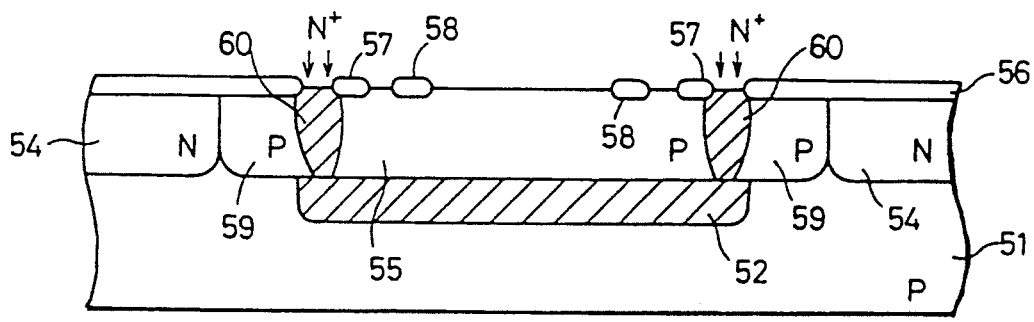
Figure 11:
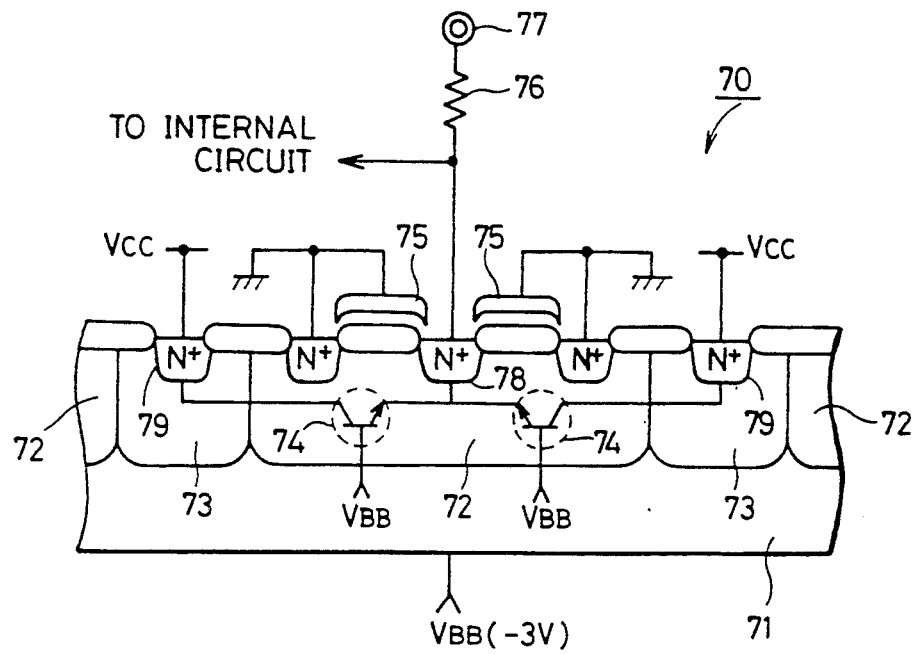
FIG. 11 is a diagram showing a conventional input circuit.
Figure 12:
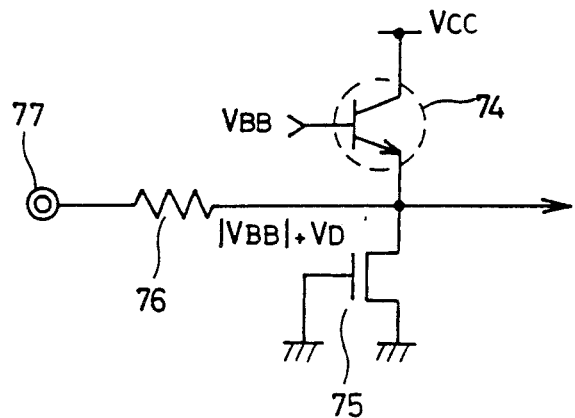
FIG. 12 is an equivalent circuit diagram of the conventional input circuit.

FIG. 5 shows another embodiment of the present invention, and FIG. 6 is an equivalent circuit of the same. Unlike the foregoing two embodiments, a P well 16 is provided on an N type semiconductor substrate 14, an N well 15 is provided therein, and an input protection circuit formed of a PMOS transistor 17 with a very thick gate oxide film is formed therein. The N well 15 is connected to the power supply voltage $V_{CC}$, and the P well 16 is connected to the ground potential. The N type semiconductor substrate 14 is connected to $V_{CC}$.

In case an input undershoot, or an input overshoot smaller than $(V_{CC}+V_D)$ V is applied to the P+ diffusion layer 18, the P-N junction between the P+ diffusion layer 18 and the N well 15 will be biased backward so that a hole which is a minority carrier will not be injected into the substrate. When an input overshoot beyond $(V_{CC}+V_D)$ V is applied, a PNP parasitic bipolar transistor 19 is turned ON, and most of the holes injected from the P+ diffusion layer 18 pass the N well 15 flowing into the ground potential through the P well 16 and a P+ diffusion layer 22. Also in this case, there is no hole injected into the substrate, accordingly. As mentioned above, in either case of an input undershoot or overshoot, no hole, which is a minority carrier, is injected into the substrate, so that the substrate voltage will not be affected.

For reference, the method of manufacturing an input circuit of a semiconductor device shown in FIGS. 3 and 5 is omitted since it is almost the same as the one shown in FIGS. 1A~1E.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an input circuit of a semiconductor device on a surface of a semiconductor substrate of a first conductivity type, comprising the steps of:

on a main surface of the semiconductor substrate, forming a first region of a second conductivity type opposite to said first conductivity type having a main surface, forming an impurity region of the first conductivity type in said first region of the second conductivity type and on said main surface, and a second region of the second conductivity type in said impurity region of the first conductivity type for applying an input voltage, and forming a third region of said second conductivity type kept at a prescribed potential on the main surface of said first region of the second conductivity type, said input voltage being applied to the internal circuit formed on the main surface of said semiconductor substrate, a P-N junction being formed between said impurity region of the first conductivity type and said second region of the second conductivity type, an excess voltage being applied to said input voltage thereby absorbing current caused by said excess voltage through the third region of said second conductivity type when said P-N junction conducts.

2. The method of manufacturing the input circuit of the semiconductor device according to claim 1, further comprising forming of a fourth region of the second conductivity type adjacent to said second region of the second conductivity type on the main surface of said impurity region of the first conductivity type.

3. The manufacturing method according to claim 1, wherein said step of forming the first impurity region of the second conductivity type comprises the step of forming by injecting ions.

4. The manufacturing method according to claim 3, wherein said step of forming the impurity region of the first conductivity type comprises the step of forming by injecting ions.

5. The manufacturing method according to claim 4, wherein said step of forming the second region of the second conductivity type comprises the step of forming by injecting ions.

6. The manufacturing method according to claim 2, wherein said step of forming the fourth region of the second conductivity type comprises the step of forming by injecting ions.

7. A method of manufacturing an input circuit of a semiconductor device on a semiconductor substrate having a first conductivity type, comprising the steps of;

on a main surface of the semiconductor substrate forming a first region of a second conductivity type opposite to said first conductivity type, injecting ions to form an impurity region of the first conductivity type in said first region of the second conductivity type and on said main surface, forming a second region of the second conductivity type in said impurity region of the first conductivity type for applying an input voltage, and forming a third region of the second conductivity type kept at a prescribed potential on the main surface of said first region of the second conductivity type, said input voltage being applied to the internal circuit formed on the main surface of said semiconductor substrate, a P-N junction being formed between said impurity region of the first conductivity type and said second region of the second conductivity type, an excess voltage being applied to said input voltage thereby absorbing current caused by said excess voltage through the third region of said second conductivity type when said P-N junction conducts.

8. The method of manufacturing the input circuit of the semiconductor device according to claim 7, further comprising forming of a fourth region of the second conductivity type adjacent to said second region of the second conductivity type on the main surface of said impurity region of the first conductivity type.

9. The manufacturing method according to claim 8, wherein said step of forming the fourth region of the second conductivity type comprises the step of forming by injecting ions.

10. A method, free of requirement for growth of epitaxial layers, of manufacturing on a surface of a semiconductor substrate of a first conductivity type an input circuit of a semiconductor device, comprising the steps of:

on a main surface of the semiconductor substrate, forming by ion injection a first region of a second conductivity type opposite to said first conductivity type and having a main surface, forming an impurity region of the first conductivity type in said first region of the second conductivity type and on said main surface, and a second region of the second conductivity type in said impurity region of the first conductivity type for applying an input voltage, and forming a third region of the second conductivity type kept at a prescribed potential on the main surface of said first region of the second conductivity type, said input voltage being applied to the internal circuit formed on the main surface of said semiconductor substrate, a P-N junction being formed between said impurity region of the first conductivity type and said second region of the second conductivity type, an excess voltage being applied to said input voltage thereby absorbing current caused by said excess voltage through the third region of said second conductivity type when said P-N junction conducts.

* * * * *